United States Patent
He et al.

(10) Patent No.: US 12,353,239 B2
(45) Date of Patent: Jul. 8, 2025

(54) SYSTEMS AND METHODS FOR QUADRATURE DELAY CLOCK GENERATION

(71) Applicant: Avago Technologies International Sales Pte. Limited, Singapore (SG)

(72) Inventors: Tim Yee He, Irvine, CA (US); Siavash Fallahi, Irvine, CA (US); Zhi Chao Huang, Irvine, CA (US); Ali Nazemi, Aliso Viejo, CA (US); Jun Cao, Irvine, CA (US)

(73) Assignee: Avago Technologies International Sales Pte. Limited, Shenzhen (CN)

( * ) Notice: Subject to any disclaimer, the term of this patent is extended or adjusted under 35 U.S.C. 154(b) by 89 days.

(21) Appl. No.: 18/213,628

(22) Filed: Jun. 23, 2023

(65) Prior Publication Data

US 2024/0427371 A1    Dec. 26, 2024

(51) Int. Cl.
| | |
|---|---|
| *G06F 1/00* | (2006.01) |
| *G06F 1/10* | (2006.01) |
| *G06F 1/12* | (2006.01) |
| *G06F 1/14* | (2006.01) |
| G06F 1/08 | (2006.01) |

(52) U.S. Cl.
CPC .................. *G06F 1/12* (2013.01); *G06F 1/10* (2013.01); *G06F 1/14* (2013.01); G06F 1/08 (2013.01)

(58) Field of Classification Search
CPC .................. G06F 1/12; G06F 1/10; G06F 1/14
USPC ........................................................ 713/501
See application file for complete search history.

(56) References Cited

U.S. PATENT DOCUMENTS

| | | | | |
|---|---|---|---|---|
| 5,399,995 | A * | 3/1995 | Kardontchik | H04L 7/033 331/25 |
| 5,974,306 | A * | 10/1999 | Hornak | H03D 7/00 455/302 |
| 7,741,926 | B2 * | 6/2010 | Kodama | H03B 21/02 375/135 |
| 11,095,426 | B1 * | 8/2021 | Li | H03K 3/0322 |
| 2017/0134194 | A1 * | 5/2017 | Papananos | H04L 27/18 |
| 2017/0250623 | A1 * | 8/2017 | Maly | H02M 7/537 |
| 2017/0373609 | A1 * | 12/2017 | Perreault | H02M 1/083 |
| 2017/0373697 | A1 * | 12/2017 | Schober | H03K 3/0322 |
| 2018/0183441 | A1 * | 6/2018 | Ryu | H03K 21/08 |
| 2019/0149141 | A1 * | 5/2019 | Hsieh | H03B 5/1228 327/116 |
| 2021/0067182 | A1 * | 3/2021 | Ravi | H04B 1/0458 |
| 2023/0318306 | A1 * | 10/2023 | Elfouly | H02J 3/08 700/286 |

* cited by examiner

Primary Examiner — Volvick Derose
(74) Attorney, Agent, or Firm — Foley & Lardner LLP (57) ABSTRACT

A solution for generating a clock using a quadrature delay can include a first plurality of in-phase (I) inverter pairs configured to output an I signal according to a first input and an inverted in-phase (inverted I) signal according to a second input, with a phase delay circuit coupled in parallel to each of the plurality of pairs. The solution can include a second plurality of quadrature (Q) inverter pairs configured to output a Q signal according to a third clock signal input and an inverted Q signal (inverted Q) according to a fourth clock signal input and a phase detector including a plurality of cells, each of which can receive at least one of the I signal, the inverted I signal, the Q signal or the inverted Q signal and include at least one or more transistors having a gate connected to a ground.

20 Claims, 6 Drawing Sheets

SYSTEMS AND METHODS FOR QUADRATURE DELAY CLOCK GENERATION

TECHNICAL FIELD

The present disclosure generally relates to phased lock loop (PLL) systems, including and not limited to systems and methods for generating clock signals in PLL designs.

BACKGROUND

Phased lock loops (PLLs) can be used in a variety of systems, such as for example communications systems, data processing and instrumentation and testing equipment. PLL circuitry can work together with other integrated circuits or devices to provide or facilitate, for example, timing synchronization for various processing operations. PLLs can vary in design and functionality, depending on their use.

SUMMARY

The present disclosure is directed to a solution for providing a quadrature delay high speed clock generation. When designing a PLL with a voltage controlled oscillator (VCO) operating at about 40-50 GHz or more to provide a data rate of about 160-200 Gbps or more, noise, parasitic capacitance and narrow tuning range of the circuitry (e.g., quadrature delay design) can make it difficult to operate the VCO at a frequency that is greater than 34 GHZ, limiting the data rate to about 136 Gbps. To overcome this challenge, the present solution provides a buffer chain circuitry with pairs of in-phase inverters and quadrature inverters, with phase delay circuits on the in-phase side of the buffer chain. The present solution provides a phase detector with a plurality of cells for processing buffer chain output signals, where each cell can include one or more (e.g., a pair) of p-type metal oxide semiconductor (PMOS) transistors having a gate tied to a voltage source supply (VSS), also referred to a ground or zero voltage. In doing so, the present solution allows the VCO of the PLL to operate at about 40-50 GHz, or more, and provide the data rate of at about 160-200 Gbps, or more, allowing for about 20% of frequency tuning range and improved performance, while saving energy.

In some aspects, the present solution relates to a circuitry or a system. The circuitry or the system can include a first plurality of pairs of inverters configured to output an in-phase signal (I) according to a first clock signal. The first clock signal can be received as a first input. The first plurality of pairs of inverters can be configured to output an inverted I signal (inverted I) according to a second clock signal. The second clock signal can be received as a second input. Each pair of the first plurality of pairs of inverters can be coupled in parallel by a first circuit to control a delay in phase between the I and the inverted I. The circuitry or the system can include a second plurality of pairs of inverters configured to output a quadrature signal (Q) according to a third clock signal. The third clock signal can be received as a third input. The second plurality of pairs of inverters can be configured to output an inverted Q signal (inverted Q) according to a fourth clock signal. The fourth signal can be received as a fourth input. The circuitry or the system can include a second circuit comprising a plurality of cells. Each of the plurality of cells can be configured to receive at least one of the I signal, the inverted I signal, the Q signal or the inverted Q signal. Each cell can include at least one or more transistors having a gate connected to a ground.

The first plurality of pairs of inverters can include a first set of four inverters connected in a first series to provide the I. The first plurality of pairs of inverters can include a second set of four inverters connected in a second series to provide the inverted I. The second plurality of pairs of inverters can include a first set of three inverters connected in a third series to provide the Q and a second set of three inverters connected in a fourth series to provide the inverted Q.

The first circuit to control the delay in phase can include one of a varactor or a combination of a capacitor and a diode in a reverse bias orientation. The first circuit to control the delay in phase includes a first capacitor connected to a first diode in a forward bias orientation connected to a second diode in a reverse bias orientation connected to a second capacitor.

The circuitry or the system can include a first inverter of a first pair of the first plurality of pairs of inverters. The first inverter can include a first output connected to the first capacitor and configured in a first set of inverters connected in a first series to provide the I. The circuitry or the system can include a second inverter of the first pair of the first plurality of pairs of inverters. The second inverter can include a second output connected to the second capacitor and configured in a second set of inverters connected in a second series to provide the inverted I.

The at least one or more transistors of each cell of the second circuit can include two p-channel metal-oxide semiconductor (PMOS) transistors. Each of the two PMOS transistors can be configured to operate in a triode region. Each cell of the plurality of cells can include a first n-channel metal-oxide semiconductor (NMOS) transistor having a drain of the first NMOS transistor connected to a drain of a first PMOS transistor of the two PMOS transistors and a gate of the first NMOS transistor coupled to a source of a second PMOS transistor of the two PMOS transistors. Each cell of the plurality of cells can include a second NMOS transistor having a drain of the second NMOS transistor coupled to a drain of the second PMOS transistor and a gate of the second NMOS transistor coupled to a source of the first PMOS transistor.

The plurality of cells of the second circuit can include a first cell, a second cell, a third cell and a fourth cell configured such that a source of the first PMOS transistor of the first cell is connected with a source of the second PMOS transistor of the fourth cell and a source of the second PMOS transistor of the first cell is connected with a source of the first PMOS transistor of the second cell. The plurality of cells can also include a source of the first PMOS transistor of the third cell that is connected with a source of the second PMOS transistor of the second cell and a source of the second PMOS transistor of the third cell that is connected with a source of the first PMOS transistor of the fourth cell.

The circuitry or the system can include a quadrature generator of a phase locked loop (PLL). The quadrature generator can include an inductor to provide as output the first clock signal, the second clock signal, the third clock signal and the fourth clock signal. The first plurality of pairs and the second plurality of pairs can be a part of a buffer chain circuit of a phase locked loop (PLL). The buffer chain circuit can be configured to provide to a phase detector of the PLL at least one of the I, the inverted I, the Q and the inverted Q at a frequency of between 40 gigahertz and 50 gigahertz.

In some aspects, the present solution relates to a method, such as a method for providing a quadrature delay high speed clock generation. The method can include a first plurality of pairs of inverters providing an in-phase signal (I)

as an output according to a first clock signal received as a first input. The method can include the first plurality of pairs of inverters providing an inverted I signal (inverted I) as an output according to a second clock signal received as a second input. Each pair of the first plurality of pairs of inverters can be coupled in parallel by a first circuit to control a delay in phase between the I and the inverted I. The method can include providing, by a second plurality of pairs of inverters, a quadrature signal (Q) as an output according to a third clock signal received as a third input. The method can include providing, by the second plurality of inverters, an inverted Q signal (inverted Q) as an output according to a fourth clock signal received as a fourth input. The method can include receiving, by a plurality of cells of a second circuit, the inverted I signal, the Q signal and the inverted Q signal to produce an output. Each of the plurality of cells can be configured to receive at least one of the I signal, the inverted I signal, the Q signal or the inverted Q signal and include at least one or more transistors having a gate connected to a ground.

The method can include a first set of four inverters of the first plurality of pairs of inverters providing the I signal. The first set of four inverters can be connected in a first series. The method can include a second set of four inverters of the first plurality of pairs of inverters providing the inverted I signal. The second set of four inverters connected in a second series. The method can include a first set of three inverters of the second plurality of pairs of inverters providing the Q. The first set of three inverters can be connected in a third series. The method can include a second set of three inverters of the second plurality of pairs of inverters providing the inverted Q. The second set of three inverters can be connected in a fourth series.

The method can include the first circuit to control the delay in phase includes a first capacitor connected to a first diode in a forward bias orientation connected to a second diode in a reverse bias orientation connected to a second capacitor. The method can include the first plurality of pairs of inverters including a first inverter of a first pair of the first plurality of pairs. The first inverter can include a first output connected to the first capacitor and configured in a first set of inverters connected in a first series to provide the I. The method can include a second inverter of the first pair of the first plurality of pairs of inverters. The second inverter can include a second output connected to the second capacitor and configured in a second set of inverters connected in a second series to provide the inverted I.

The at least one or more transistors of each cell of the second circuit can include two p-channel metal-oxide semiconductor (PMOS) transistors, each of the two PMOS transistors configured to operate in a triode region. Each cell of the plurality of cells can include a first n-channel metal-oxide semiconductor (NMOS) transistor having a drain of the first NMOS transistor connected to a drain of a first PMOS transistor of the two PMOS transistors and a gate of the first NMOS transistor coupled to a source of a second PMOS transistor of the two PMOS transistors. Each cell of the plurality of cell can include a second NMOS transistor having a drain of the of the second NMOS transistor coupled to a drain of the second PMOS transistor and a gate of the second NMOS transistor coupled to a source of the first PMOS transistor.

The plurality of cells of the second circuit can include a first cell, a second cell, a third cell and a fourth cell configured such that a source of the first PMOS transistor of the first cell is connected with a source of the second PMOS transistor of the fourth cell and a source of the second PMOS transistor of the first cell is connected with a source of the first PMOS transistor of the second cell. The plurality of cells of the second circuit can each include a source of the first PMOS transistor of the third cell that is connected with a source of the second PMOS transistor of the second cell and a source of the second PMOS transistor of the third cell that is connected with a source of the first PMOS transistor of the fourth cell.

The method can include a quadrature generator of a phase locked loop (PLL) comprising an inductor and providing the first clock signal, the second clock signal, the third clock signal and the fourth clock signal as output. The first plurality of pairs and the second plurality of pairs can be a part of a buffer chain circuit of a phase locked loop (PLL). The buffer chain circuit can be configured to provide to a phase detector of the PLL at least one of the I, the inverted I, the Q and the inverted Q at a frequency of between 40 gigahertz and 50 gigahertz.

In some aspects, the present solution can be directed to a system. The system can include a circuitry for providing a clock signal. The circuitry can include a voltage control oscillator utilizing an inductor to generate a first clock signal, a second clock signal, a third clock signal and a fourth clock signal. The circuitry can include a buffer chain circuit. The buffer chain circuit can include a first plurality of pairs of inverters configured to output an in-phase signal (I) according to a first clock signal received as a first input and an inverted I signal (inverted I) according to a second clock signal received as a second input. Each pair of the first plurality of pairs of inverters can be coupled in parallel by a first circuit to control a delay in phase between the I and the inverted I. The circuitry can include a second plurality of pairs of inverters configured to output a quadrature signal (Q) according to a third clock signal received as a third input and an inverted Q signal (inverted Q) according to a fourth clock signal received as a fourth input. The circuitry can include a phase detector comprising a plurality of cells, each of the plurality of cells configured to receive at least one of the I signal, the inverted I signal, the Q signal or the inverted Q signal. Each cell can include at least one or more transistors having a gate connected to a ground.

The system can include the first plurality of pairs of inverters that includes a first set of four inverters connected in a first series to provide the I and a second set of four inverters connected in a second series to provide the inverted I. The system can include the second plurality of pairs of inverters that includes a first set of three inverters connected in a third series to provide the Q and a second set of three inverters connected in a fourth series to provide the inverted Q. The first circuit to control the delay in phase can includes one of a varactor or a combination of a capacitor and a diode in a reverse bias orientation.

BRIEF DESCRIPTION OF THE DRAWINGS

These and other aspects and features of the present embodiments will become apparent to those ordinarily skilled in the art upon review of the following description of specific embodiments in conjunction with the accompanying figures.

DETAILED DESCRIPTION

The present embodiments shall now be described in detail with reference to the drawings, which are provided as illustrative examples of the embodiments so as to enable those skilled in the art to practice the embodiments and alternatives apparent to those skilled in the art. Figures and examples below are not meant to limit the scope of the present embodiments to a single embodiment, but other embodiments are possible by way of interchange of some or all of the described or illustrated elements, or those apparent to a person of ordinary skill in the art. Certain elements of the present embodiments can be partially or fully implemented using known components, only those portions of such known components that are necessary for an understanding of the present embodiments shall be described, and detailed descriptions of other portions of such known components will be omitted so as not to obscure the present embodiments. Embodiments described in their illustrated contexts should not be limited thereto. For example, embodiments described as being implemented in software should not be limited to such implementation alone, but they can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

When designing a quadrature phase locked loop (PLL), it can be desirable to provide the in-phase signal (I), the in-phase inverted signal (inverted I), the quadrature signal (Q) and the inverted quadrature signal (inverted Q) at a high frequency rate that is greater than 34 GHz. The in-phase signal can include a signal that is in phase (e.g., has same frequency and phase) as a reference (e.g., sinusoidal) signal that the PLL can use as a reference for the operations (e.g., timing) within the PLL. The Inverted I signal can be a complement to the I signal (e.g., phase shifted from the I signal by 180 degrees), while the Q signal can be phase shifted by 90 degrees from the I signal and the inverted Q signal can be a complement to the Q signal (e.g., 180 degrees out of phase with respect to the Q signal and 270 degrees shifted from the I signal).

In one example, a VCO of a PLL can be expected to operate at a frequency of 50 GHz or more in order to support a data rate of 200 Gbps, or more. In such instances, it can be difficult to overcome the noise (e.g., phase noise), parasitic capacitance and the narrow tuning range of the PLL circuitry generating and processing the I, the inverted I, the Q and the inverted Q signals, which can limit the maximum frequency and the data rate of the system. As a system generates the clock signals or clock signal inputs that can be sent to a buffer chain circuit 110, the sections of the buffer chain circuit processing the I and Q signals (and their inverted counterparts) can each utilize separate varactor-based phase delay circuits to help provide tuning control and phase delay adjustments. However, capacitor loading can be difficult to overcome as the frequency is increased above 34 GHz, causing the clock swing and skew mismatch to build up and the clock output to fail as the system approaches the 136 Gbps data rate. This makes it difficult to provide clock circuitry for 200 Gbps data rates.

The present solution overcomes these challenges by providing a buffer chain circuit using I inverter pairs of inverters for processing the I and inverted I signals and Q inverter pairs of inverters to process the Q and the inverted Q signals, along with phase delay circuits coupled to the outputs of each of the I inverter pairs. The phase delay circuits can be coupled to the outputs of each of the I inverter pairs directly or indirectly (e.g., via other circuitry or components). For example, a phase delay circuit can be connected with an output of an inverter of an I inverter pair directly or via other components (e.g., one or more diodes, transistors and capacitors). The present solution can further include a phase detector configured to include a plurality of cells for receiving and processing buffer chain circuit output signals (e.g., I, inverted I, Q and inverted Q), such that each of the cell of the phase detector uses one or more (e.g., a pair) of PMOS transistors having their gate tied to a VSS signal (e.g., ground or zero volt signal). The cells can further include one or more (e.g., a pair) of NMOS transistors coupled in series (e.g., drain to drain) with the PMOS transistors and having their gates coupled with the source of the other PMOS transistor in the circuit. The transistors and their respective parts (e.g., gates, sources or drains) can be coupled to each other directly or indirectly (e.g., via other circuitry or components). The present solution can utilize the improved buffer chain circuit and phase detector circuitry to allow the VCO of the PLL to operate at a frequency of 50 GHz or above, thereby allowing the system to operate at a data rate of 200 Gbps or more. The present solution can also allow for about 20% of frequency tuning range for the system, improving the system performance, while saving energy.

Figure 1:
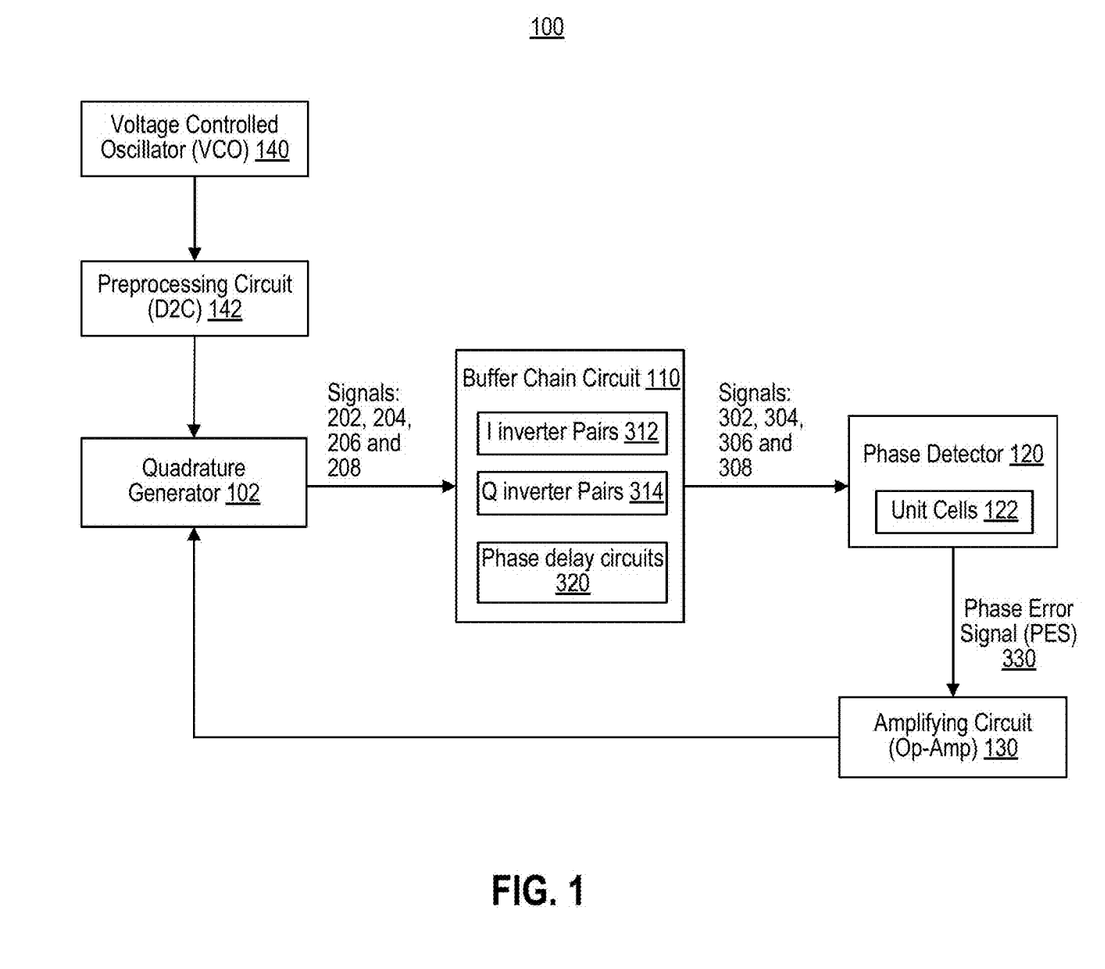
FIG. 1 is an example block diagram of a system for quadrature delay high speed clock generation for a phased locked loop (PLL).

FIG. 1 illustrates a block diagram of an example system 100 for quadrature delay clock generation. System 100 can include or be coupled with a circuitry for generating, processing or providing a clock signal using a quadrature-based phased locked loop (PLL). System 100 can include one or more voltage controlled oscillators (VCOs) 140 coupled with or including one or more preprocessing circuits (D2C) 142 and quadrature generators 102. System 100 can also include one or more buffer chain circuits 110, phase detectors 120 and amplifying circuits 130. For example, a system 100 providing a clock signal using a quadrature PLL can include a VCO 140 including a quadrature generator 102 that can provide to a buffer chain circuit 110 a first input 202 signal (e.g., input for I signal), a second input 204 signal (e.g., input for inverted I signal), a third input 206 signal (e.g., input for Q signal) and a fourth input 208 signal (e.g., input for inverted Q signal). Upon receiving the input signals 202, 204, 206 and 208, the buffer chain circuit 110 can use its in-phase (I) inverter pairs 312 and quadrature (Q) inverter pairs 314 along with phase delay circuits 320 to provide, to a phase detector 120, output signals 302 (the in-phase or I signal), 304 (the inverted in-phase, or inverted I), 306 (the quadrature or Q signal) and 308 (the inverted quadrature, or inverted Q signal). Upon receiving the I 302, inverted I 304, Q 306 and the inverted Q 308 signals, the phase detector 120 can use its unit cells 402 to provide a phase error signal (PES) 330. The amplifying circuit 130 can receive and amplify the PES 330 and provide it back to the VCO 140, which can then use it to provide a feedback to the quadrature generator 102 to adjust the signals 202, 204, 206 and 208 for the next cycle (e.g., loop) of the clock generating system 100.

System 100 can include or utilize any circuitry or combination of hardware and software for providing a clock signal, such as a quadrature PLL, for synchronizing processing of a circuit or device. A PLL can include any circuitry that can include a feedback comparing a phase of an input signal (e.g., a reference signal) with the phase of a controlled oscillator's output signal in order to generate an output signal that is synchronized with the reference signal. The output signal can be synchronized with the reference signal, for example, in frequency and/or in phase. System 100 can compare the phases of the reference signal (e.g., in-phase signal 302) and the output from the VCO 140 to generate a phase error signal 330. For example, the VCO 140 can include the quadrature generator 102 and/or buffer chain circuit 110. The phase error signal 330 can be filtered (e.g., by the loop filter) to remove noise and unwanted frequency components. The signal filtered by the loop filter can be used to control the VCO 140 and adjust its frequency and phase to minimize the phase error. Using a feedback loop, the system 100 can constantly compare the phases of the reference signal (e.g., I signal 302) and the VCO 140 output signal, having the VCO 140 adjust its frequency and phase to minimize the phase difference. By continuously minimizing the phase difference, the system 100 can achieve the phase lock, and have the VCO 140 output signal maintain a stable and precise phase relationship (e.g., lock) with the reference signal (e.g., I signal 302).

System 100 can include or be coupled (e.g., directly or indirectly via one or more circuits) with a quadrature PLL and utilized in a variety of systems or devices. For example, a quadrature PLL circuitry can be utilized or coupled (e.g., directly or indirectly) with any system or device in which a precise phase synchronization is utilized. For example, a system 100 can include or use a quadrature PLL circuitry can generate, include, use or process I 302, inverted I 304, Q 306 and inverted Q 308 signals. Quadrature PLL circuitry can be utilized in communication systems, such as cellular networks (e.g., 3G, 4G or 5G networks) or wireless local area networks (WLANs), for example to modulate or demodulate signals. System 100 can include or use a quadrature PLL circuitry in a digital broadcasting systems such as a digital audio and video broadcasting or a high definition television system. System 100 can include or use a quadrature PLL circuitry in a radar system, a signal acquisition and monitoring system or test equipment. System 100 can include or use a quadrature PLL circuitry in a frequency synthesizing system to generate stable and precise output frequencies.

Quadrature generator 102 can include any circuitry that can produce two periodic, oscillating signals that are 90 degrees out of phase with each other. These two signals (e.g., the in-phase (I) 202 clock input signal and quadrature (Q) 205 clock input signal) can be used to monitor and control a phase difference between two signals. Quadrature generator 102 can include any circuitry generating or providing input signals 202, 204, 206 and 208, sometimes also referred to as clock signals that can be input into the buffer chain circuit 110. Quadrature generator 102 can include a preprocessing circuit (e.g., D2C) 142, which can include buffer circuitry to generate a positive and negative VCO frequency signals (e.g., as in FIG. 2), that can be processed using inverters in parallel with resistor and diode pairs and input into inductors 210. Clock signals (e.g., signals 202, 204, 206 or 208) can be any oscillating or electrical signal that can act or be used as a timing reference for coordinating and synchronizing operations of circuits. For instance, clock signals can include oscillating signals passed through an through an inductor 210 prior to input into the buffer chain circuit 110. For example, quadrature generator 102 can generate or produce a signal 202, also referred to as the first clock signal 202 as well as an input signal 206, also referred to as the second clock signal 202. The first clock signal 202 and the second clock signal 206 can be generated, provided or used by the pairs of inverters 312, also referred to as I inverter pairs 312 of the buffer chain circuit 110, to produce the in-phase 302 (e.g., I 302) and quadrature 306 (Q 306) signals. Likewise, quadrature generator 102 can generate or provide input signal 206, also referred to as the third clock signal 206, and input signal 208, also referred to as the fourth clock signal 208. The third clock signal 206 and the fourth clock signal 208 can be generated, provided or used by the pairs of inverters 314, also referred to as the Q inverter pairs 314, to produce Q 306 and inverted Q 308 signals.

Quadrature generator 102 can be included within or coupled (e.g., directly or indirectly) with a VCO 140 also including a buffer chain circuit 110, allowing the VCO 140 to generate and provide the I 302 signal, Q 306 signal, as well as the inverted I 304 and inverted Q 308. Quadrature generator 102 can include the functionality (e.g., circuitry) for generating or providing the inverted counterparts to the I 302 and Q 306 signals (e.g., inverted I 304 and inverted Q 308). In some embodiments, quadrature generator 102 can include the functionality for generating inputs for providing the inverted I and Q signals (e.g., input 204 for inverted I signal, input 208 for inverted Q signal) to be processed by the buffer chain circuit 110. Quadrature generator 102 can generate inputs for I and Q signals (e.g., 202 and 206) such that they are phase-shifted by 90 degrees from each other (e.g., a quarter of a cycle, or half pi shift). Similarly, quadrature generator 102 can generate inputs for inverted I and Q signals (e.g., 204 and 208) that can be phase-shifted by 90 degrees from each other. Signals 202, 204, 206 and 208 can be provided so that they are in quadrature with each other (e.g., signal 202 is 90 degrees from signal 204, which is 90 degrees from 206, which is 90 degrees from 208, which is 90 degrees from 202). Signals 202, 204, 206 and 208 can be used for various purposes, including generating a quadrature local oscillator signal, performing phase detection, or providing phase synchronization. Quadrature generator 102 can be coupled (e.g., directly or indirectly) with or include a buffer chain circuit 110 for processing, filtering or controlling the phases or delay between signals generated by the quadrature generator (e.g., I, inverted I, Q and inverted Q).

Quadrature generator 102 can be implemented in various ways. For example, a quadrature generator 102 can include or use digital and/or analog circuitry, such as operational amplifiers (op-amps), filters, and phase-shifting networks, to produce the desired phase relationship between the I and Q signals. Quadrature generator 102 can include a digital design in which I and Q signals can be generated using digital signal processing techniques, such as digital mixers, digital filters, and delay elements to process the phase and frequency of the input signals to achieve the desired quadrature relationship. For example, quadrature generator 102 can include a Hilbert transform to utilize a technique that can generate the quadrature components of a signal by applying the Hilbert transform to the input signal to derive the I and Q signals.

Amplifying circuit 130 can include any circuitry for amplifying an input signal (e.g., a phase error signal 330). Amplifying circuit 130 can include a combination of NMOS and/or PMOS devices for amplifying any signal described herein. Amplifying circuit 130 can include an operational amplifier (op-amp) 130 which can include any circuit for amplifying and/or processing an analog signal. An amplifying circuit 130 can include, for example, a high-gain differential amplifier with multiple inputs (e.g., inputs for inverting and non-inverting signals) and one or more outputs. An amplifying circuit 130 130 can receive phase error signal 330 and/or control signal from a phase detector 120 and amplify the received signals to provide an output for quadrature generator 102 and/or the VCO 140.

For example, an amplifying circuit 130 (e.g., an op-amp 130) can be used to multiply I 302 and Q 306 signals together and produces an output that is proportional to the product of their amplitudes. For example, the output of the op-amp 130 can correspond to the phase difference between the I 302 and Q 306 signals. The resulting output can be processed further to generate a control voltage for the VCO 140. For example, op-amp 130 can be used as a mixer or a phase comparator to combine the I 302 and Q 306 signals and performs a phase comparison. Op-amp 130 can multiply or compare the phase between any of the 302, 304, 306 and/or 308 signals. For example, the output of the op-amp 130 can include a phase difference or a product of any of the 302, 304, 306 and 308 signals. When op-amp 130 is used to provide a phase difference, the output from the op-amp 130 can be converted into a control voltage to adjust the VCO 140 frequency and achieve the phase lock for the system 100 (e.g., the PLL circuit).

Voltage controller oscillator (VCO) 140 can include any circuitry or a combination of hardware and software for generating an output signal with a frequency that is controlled by a voltage input (e.g., an input from an op-amp 130). VCO 140 can include a circuitry providing an oscillating signal, producing a periodic waveform (e.g., a sine wave or a square wave) whose frequency can be adjusted by applying a control voltage. VCO 140 can include the circuitry to generate an output signal, which can be referred to as a local oscillator (LO) signal. The LO signal of the VCO 140 can be phase-locked to a reference signal (e.g., I signal 302) through a feedback loop. The phase and the frequency of the VCO 140 output signal (e.g., LO) can be continuously adjusted to minimize the phase difference between the reference signal (e.g., in-phase 302) and the VCO output signal (e.g., LO).

VCO 140 can include or be connected (e.g., directly or indirectly) with a preprocessing circuit 142 (e.g., D2C) and/or quadrature generator 102. VCO 140, preprocessing circuit 142 or quadrature generator 102 can receive the amplified phase error signal 330 output from the phase detector 120 and use it to adjust the voltage controlling the frequency of the VCO 140. In doing so, the VCO 140 can ensure that it outputs a signal (e.g., LO) closely tracking the I 302 signal, thereby maintaining the desired quadrature relationship with the other signals (e.g., I 304, 306 and 308).

VCO 140 can vary based on the design. VCO 140 can include any combination of hardware and software comprising or providing an electronic oscillator whose oscillation frequency is controlled by a voltage input. In some embodiments, VCO 140 can include the preprocessing circuit 142 and the quadrature generator 102. In some embodiments, VCO 140 can include the buffer chain circuit 110. For example, VCO 140 can utilize its own quadrature generator 102 to generate input signals 202, 204, 206 and 208 as well as its own buffer chain circuit 110 to utilize inverters 310 that can be arranged into I inverter pairs 312, Q inverter pairs 314 and phase delay circuits 320 to provide I 302, inverted I 304, Q 306 and inverted Q 308 signals to the phase detector 120

Buffer chain circuit 110 can include any combination of hardware and software for processing input signals 202, 204, 206 and/or 208 to provide output signals I 302, inverted I 304, Q 306 and/or inverted Q 308. Buffer chain circuit 110 can include inverters 310 organized in I inverter pairs 312 and Q inverter pairs 314. Buffer chain circuit 110 can include phase delay circuits 320 for setting, maintaining or controlling the phase delay or offset between the I 302 signal and its inverted counterpart (e.g., inverted I signal 304) which can be at 180 degrees apart from the I 302. For example, the inverted I 304 can be a differential signal (e.g., 180 degree offset) of the I 302 signal. Buffer chain circuit 110 can also include the functionality for setting, maintaining or controlling the phase delay or offset between the Q 306 signal and its inverted counterpart (e.g., inverted Q signal 308), so that the inverted Q signal 308 is also 180 degrees apart from the Q 306 signal. Likewise, buffer chain circuit 110 can include the functionality (e.g., phase delay circuits 320 and I inverter pairs 312 and Q inverter pairs 314) to maintain the I 302 signal 90 degrees apart from the Q signal, and therefore maintaining the inverted I signal 304 also 90 degrees apart from the inverted Q signal.

Phase detector (PD) 120 can include any circuitry for comparing a phase difference between the input reference signal (e.g., I 302 signal) and the feedback signal, such as a signal generated by the buffer chain circuit 110 or VCO 140. The output of the phase detector 120 can be used to adjust the VCO frequency to minimize the phase difference between the reference and feedback signals. Phase detector 120 can include the cells 402 for receiving and processing each of the quadrature signals (e.g., I 302, inverted I 304, Q 306 and inverted Q 308). The phase detector 120 can process or operates on the signals 302, 304, 306 and 308 to produce an output representing the phase difference between the reference and the feedback signals.

Phase detector 120 can receive from a buffer chain circuit 110, I 302 signal (e.g., the reference signal) to be compared with the feedback signal from the VCO. Phase detector 120 can also receive and use the inverted I 304 (e.g., complement of I 302 signal), Q 306 signal and the inverted Q signal 308 (e.g., complement of the Q 306). The phase detector 120 can multiply the in-phase (e.g., I 302 and/or inverted I 304) and quadrature (e.g., Q 306 and inverted Q 308) signals, and then subtracts the product of the inverted in-phase and inverted quadrature signals to provide a phase error signal 330 that can be represented as PES 330=(I 302×Q 306)−(inverted I 304×inverted Q 308). The phase error signal 330 can then be low-pass filtered to remove high-frequency components and provided to the VCO 140 to control the frequency of the VCO 140. By adjusting the VCO 140 frequency based on the PES 330, the system 100 can achieve phase synchronization between the input reference signal and the feedback signal, generating an output clock signal that is phase-locked to the input reference signal.

Figure 2:
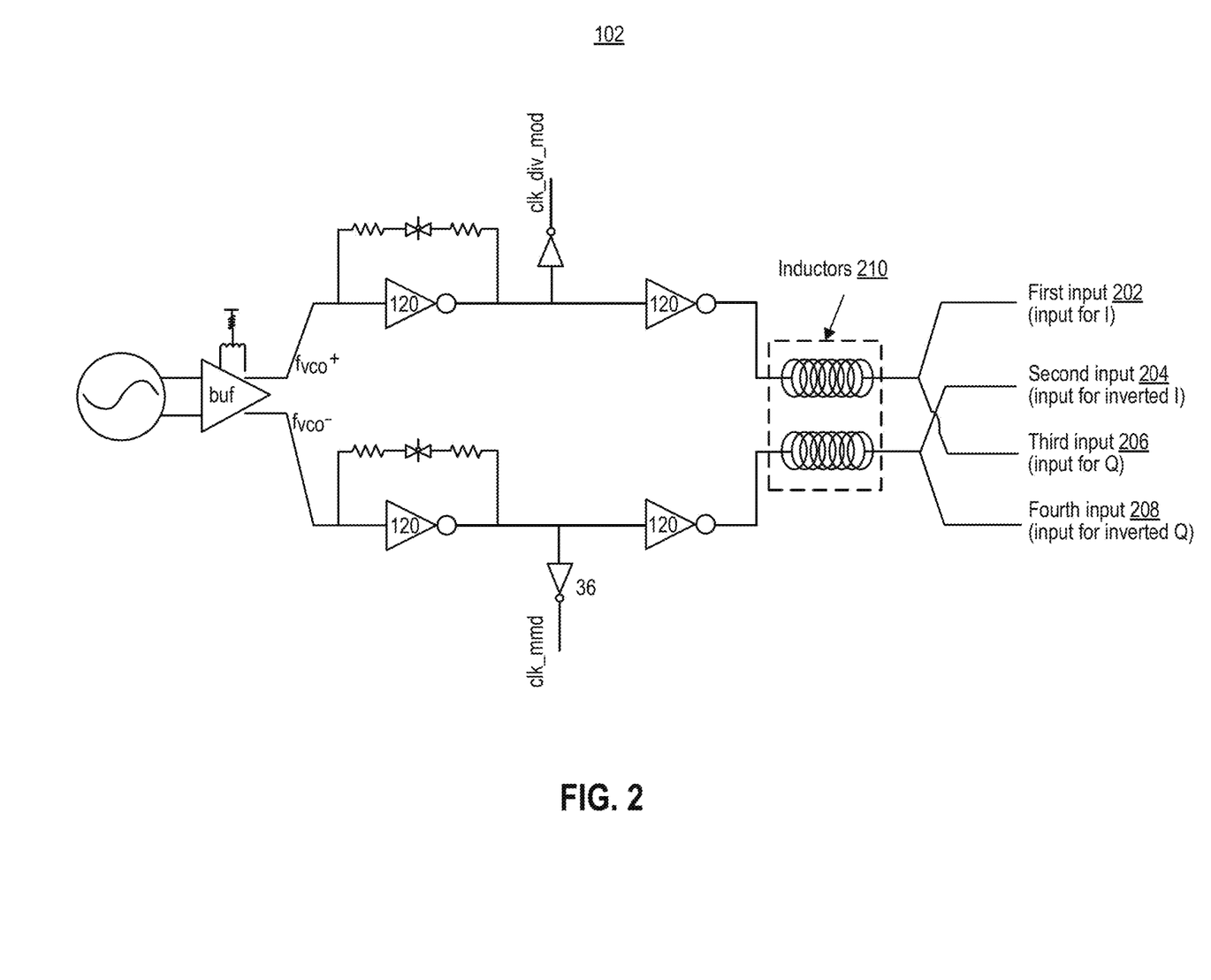
FIG. 2 is an example of a quadrature generator of the system for quadrature delay high speed clock generation.
Figure 3:
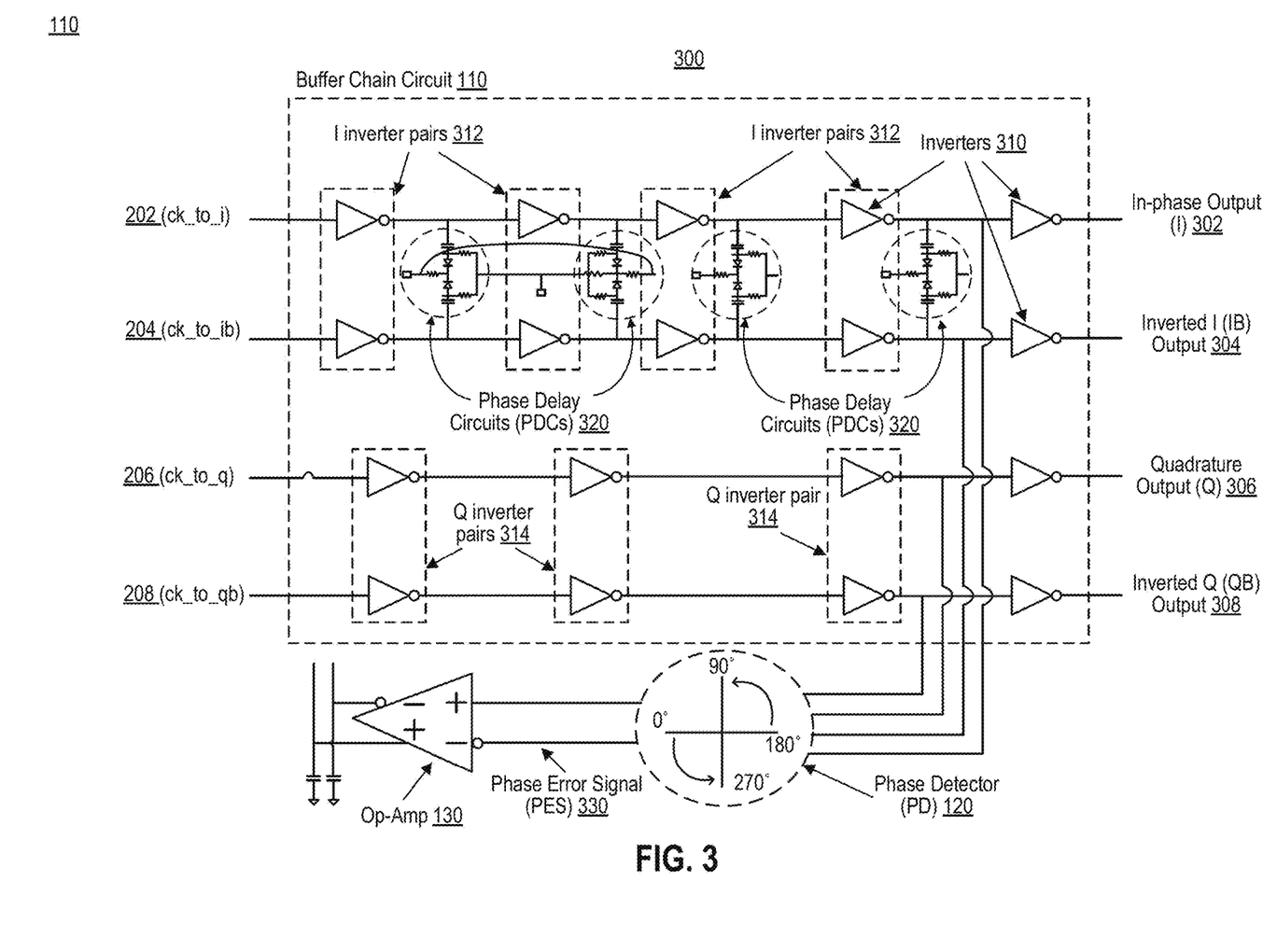
FIG. 3 is an example of a buffer chain circuit of the system for quadrature delay high speed clock generation.
Figure 4:
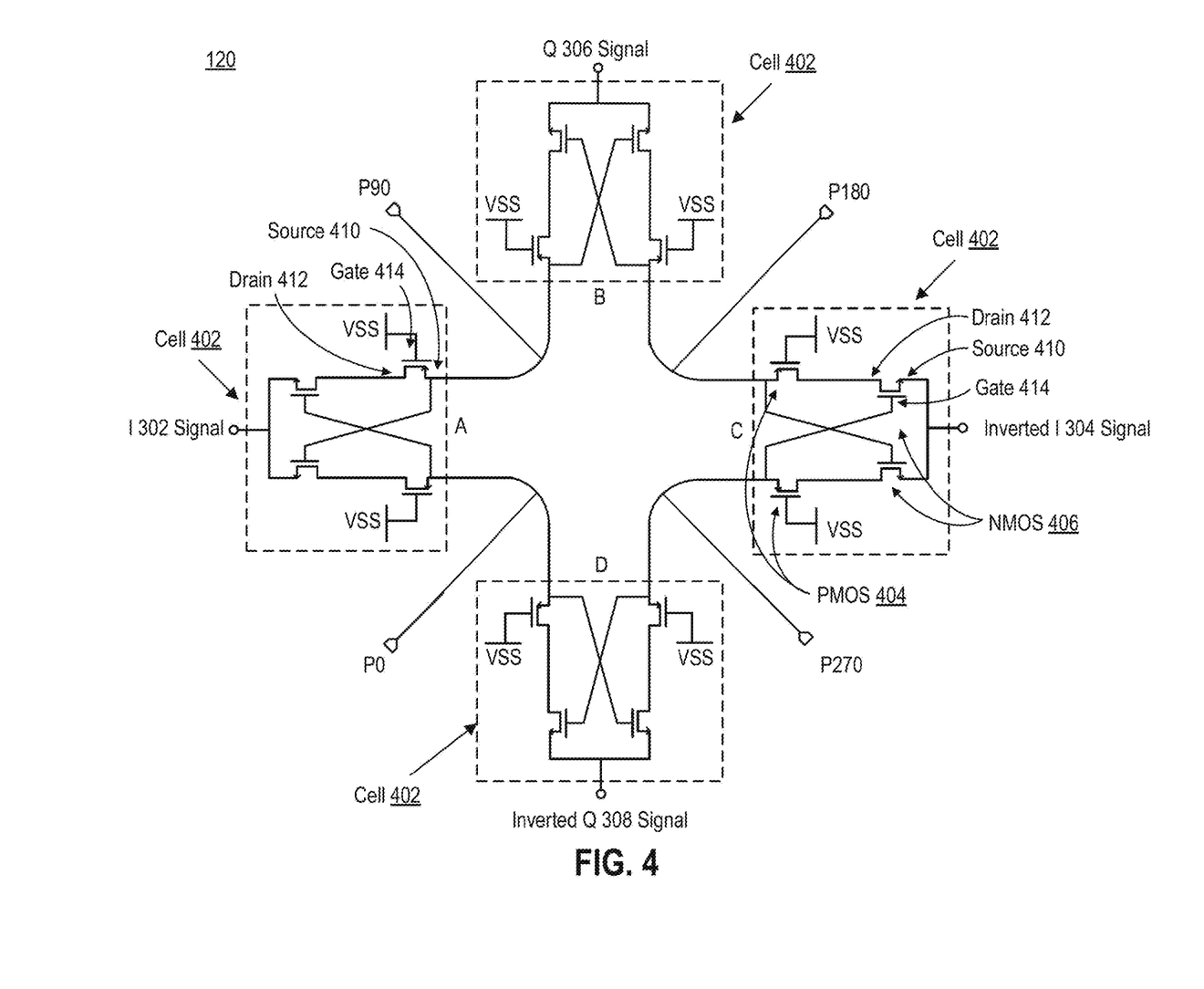
FIG. 4 is an example of a phase detector circuit of the system for quadrature delay high speed clock generation.

FIGS. 2-4 illustrate an example system 100 for generating a clock using a quadrature generator 102 shown in FIG. 2 along with a buffer chain circuit 110 presented in FIG. 3 and a phase detector 120 of FIG. 4. At a high level, quadrature generator 102 example of FIG. 2 can utilize circuitry, including inductors 210, to provide inputs 202, 204, 206 and 208, which can be provided to a buffer chain circuit 110. The buffer chain circuit 110 example illustrated in FIG. 3 can receive the inputs 202, 204, 206 and 208 and process them using inverters 310 (e.g., arranged in I inverter pairs 312 and Q inverter pairs 314) and fixed delay circuits to generate, process, filter or provide I 302, inverted I 304, Q 306 and inverted Q 308 signals. Signals 302, 304, 306 and 308 can then be provided to the example phase detector 120 illustrated in FIG. 4 to be processed using four cells 402 formed using PMOS transistors 404 and NMOS transistors 406, interconnected via their individual sources 410, drains 412 and gates 414.

FIG. 2 is an example of a quadrature generator 102 of the system for quadrature delay high speed clock generation. The quadrature generator 102 can include a sinusoidal signal, such as from a device or a circuit providing an oscillating signal. The signal can then be inserted into a buffer circuit. The buffer circuit can be coupled with a coil to help with impedance matching, filtering or tuning of the signal or signal conditioning. The buffer can provide two outputs, including a positive VCO signal and a negative VCO signal. The two VCO signals can be processed via a package of multiple inverters (e.g., 120 inverters) that can be placed in parallel with a resistor circuit having one or more resistors and reverse biased diodes. A reverse biased diode can be any diode (e.g., PN junction or a varactor) connected in a reverse bias orientation (e.g., so that the voltage across the diode is in a direction that impedes or stops the flow of current across the diode). The diode can be connected directly or indirectly (e.g., via one or more intervening circuits or components) The varactor, which can also be referred to as a varactor diode, can be disposed or connected in a reverse bias orientation. The varactor, or the varactor diode, can include any semiconductor device (e.g., a p-n junction diode) with a voltage-dependent capacitance. The varactor diode can also be connected or disposed in a forward bias. The varactor diode can be controlled by amplifying circuit for loop control. The positive and negative VCO frequency outputs can be provided as inverted clock signals modulated by their inductor 210.

Quadrature generator 102 can include the circuitry of functionality for generating one or more signals, such as signals for creating signals 202, 204, 206 and 208. Quadrature generator 102 can include, or be connected directly or indirectly with, a preprocessing circuit 142 that can utilize one or more inverters 310, diodes and resistors, the output of which can be input into one or more inductors 210. Preprocessing circuit 142, also referred to as a D2C, can include a digital to analog converter to convert digital into analog signals. For instance, preprocessing circuit 142 can use a digital to analog converter to convert the digital control word, representing desired frequency or phase adjustment from the PLL, from the digital loop filter or digital control circuitry into an analog voltage controlling the frequency and phase of the VCO 140. Preprocessing circuit 142 can include a divide-by-2 counter, to divide the frequency of an input signal, such as by a factor of two or four. The D2C can be used in the feedback path of the PLL to create a frequency divider that ensures the output signal of the VCO 140 is locked to the reference signal. By dividing the frequency, the D2C can allow precise adjustment of the VCO 140 output frequency.

Inductors 210, also referred to as inductor coils 210, can include any configuration or amount of looped conductive material (e.g., metal wiring) to produce induction. Inductors 210 can be included in the preprocessing circuit 142 and can receive outputs from the preprocessing circuit 142 to generate signals 202, 204, 206 and 208. The number of loops of the wiring can be configured (e.g., tuned) to match the impedance, filter or tune the signal so as to increase or boost the swing of the signal outputs for the load. Inductors 210 can provide four output signals which can be used as inputs into the buffer chain circuit 110 in FIG. 3. The four output signals can include a first input 202 (e.g., input for I signal 302), a second input 204 (e.g., input for inverted I 304), a third input 206 (e.g., input for Q signal 306) and a fourth input 208 (e.g., input for inverted Q 308).

FIG. 3 illustrates an example 300 of a system 100 in which a buffer chain circuit 110 receives input signals 202, 204, 206 and 208 generated by the quadrature generator 102 at FIG. 2 and provide corresponding outputs I 302, inverted I 304, Q 306 and inverted Q 308. The output signals I 302, inverted I 304, Q 306 and inverted Q 308 can be provided to the phase detector 120, which can then process these inputs and provide a phase error signal 330 to the amplifying circuit 130 (e.g., the op-amp 130). In combination with the quadrature generator 102 of FIG. 2 and phase detector 120 of FIG. 4, the buffer chain circuit 110 can provide a clock generating system 100 utilizing quadrature delay in accordance with the present solution.

Buffer chain circuit 110 can include a configuration or arrangement of four or five inverters 310 connected in a first series and used to provide an I 302 signal according to a first input 202 or second input 204. Generating signals 302, 304, 306 or 308 according to input clock signals 202, 204, 206 or 208 can include generating, processing or providing output signals (e.g., 302, 304, 306 or 308) using circuitry (e.g., buffer chain circuit 110) processing input clock signals 202, 204, 206 or 208. For example, the first input 202 (e.g., first clock signal) can be input into an I inverter pair 312 of the plurality of I inverter pairs 312 generating the in-phase output 302. For example, I 302 signal can be generated as an output from the last one of the four cascaded I inverter pairs 312 where the first input 202 (e.g., first clock signal) is input a first inverter 310 of the first I inverter pair 312.

The input to the phase detector 120 from the first series of inverters 310 (e.g., inverted I 304 signal) can be extracted after a fourth inverter 310 in the first series. Likewise, a second configuration of five inverters 310 connected in a second series can be used to provide an inverted I 304 signal according to a second input 204 or first input 202, whereas the input from the second series to the phase detector 120 can be extracted after a fourth inverter 310 in the second series. A third configuration of four inverters 310 connected in a third series can be used to provide a Q 306 signal according to a third input 206 or fourth input 208, whereas the input from the third series to the phase detector 120 (e.g., inverted Q 308 signal) can be extracted after a third inverter 310 in the third series. Likewise, a fourth configuration of four inverters 310 connected in a fourth series can be used to provide a Q 306 signal according to a third input 206 or fourth input 208, where the input from the fourth series to the phase detector 120 can be extracted after a third inverter 310 in the fourth series. Therefore, I 302 and inverted I 304 can be provided to the phase detector 120 upon processing by a series of four inverters 310 in each of the two series of inverters for the I 302 and inverted I 304 inverter arrangements. Similarly, Q 306 and inverted Q 308 can be provided to the phase detector 120 upon processing by series of three inverters 310 in each of the two series of inverters for the Q 306 and inverted Q 308.

I inverter pairs 312 can each include a pair of inverters 310 including an inverter 310 from the first series (e.g., inverters 310 used to process or produce the I 302) and an inverter 310 from the second series (e.g., inverters 310 used to process or produce the inverted 304). Buffer chain circuit 110 can include five I inverter pairs 312, where the output signals (e.g., 302, 304) are extracted or provided after the fourth I inverter pair 312 in the series of I inverter pairs 312.

I inverter pairs 312 can be organized or arranged so that each of the two inverters 310 of the I inverter pair 312 has its output (e.g., of the inverter 310) coupled with one of the two ends of the phase delay circuits 320 connecting to the I inverter pair 312 in parallel. For example, a first inverter 310 from a first I inverter pair 312 (e.g., from the first series for I 302 signal) can have its output coupled to a first input of the phase delay circuit 320, while a second inverter 310 from the same first I inverter pair 312 (e.g., from the second series for inverted I 304 signal) can have its output coupled to the other input of the same phase delay circuit 320. Accordingly, each of the first four of the five I inverter pairs 312 for the first and the second series of inverters 310 can each have its own individual phase delay circuit 320 that is coupled to the outputs of the inverters 310 of the given I inverter pair 312.

Phase delay circuit (PDC) 320 can include any circuitry for establishing, fixing, setting, maintaining or correcting a delay in phase (e.g., phase delay) between the inputs 202, 204, 206 and 208 or outputs I 302, inverted I 304, Q 306 and inverted Q 308. The delay in phase established or affixed by the PDC 320 can be a phase of 90 degrees between the I and Q signals or Q and inverted I signals. The delay in phase can include 180 degrees phase shift between I and inverted I signals or between Q and inverted Q signals. For example, a PDC 320 can, alone or in combination with other circuitry of the buffer chain circuit 110, maintain a 90 degree phase difference between a I 302 and Q 306 signals. PDC 320 can likewise, alone or in combination with other circuitry of the buffer chain circuit 110, maintain a 180 degree phase difference between I 302 and inverted I 304 signals. PDC 320 can ensure that each of the I 302, Q 306, inverted I 304 and inverted Q 308 are spaced apart from each other by 90 degrees, thereby maintaining quadrature profile of the signal outputs.

PDC 320 can include a combination of capacitors, resistors and/or diodes. PDC 320 can include input capacitors that can be coupled to the outputs of the inverters 310. For example, a first input capacitor of the PDC 320 can be coupled to the output of the first inverter 310 of the I inverter pair 312 and a second input capacitor of the PDC 320 can be coupled to the output of the second inverter 310 of the I inverter pair 312. The input capacitors of the PDC 320 can be coupled (on the opposite end from the inverters 310) to a diode, such as a varactor diode or any diode (e.g., PN junction) that can be arranged or configured in a forward bias (e.g., voltage across the diode permits the natural flow of current across the diode) or a reverse bias orientation (e.g., the voltage across the diode impedes or stops the flow of current across the diode). For example, the varactor diode can be disposed or connected in a reverse bias orientation. The varactor diode can be connected or disposed in a forward bias. The varactor diode can be controlled by amplifying circuit for loop control. Coupled with the diodes (e.g., in between the two diodes arranged in opposite bias to each other), there can be an input signal for tuning or adjusting the phase delay circuit 320, or a node for a readout (e.g., output analysis).

For example, a PDC 320 can include a first input capacitor connected to a first inverter 310 of an I inverter pair 312 that is also coupled to a forward biased diode, which can be further coupled with another diode in an opposite bias (e.g., reverse biased), which can be further coupled to a second input capacitor for connecting to the output of the other inverter 310 of the I inverter pair 312. Input signal for tuning the PDC 320 can be provided in between the two diodes. Diodes used can include any type of diodes, such as a PN junction diode, varactor diode or any other diode. Buffer chain circuit 110 can include four PDCs 320 for the first four I inverter pairs 312, after which the output signals can be extracted and provided to the phase detector 120. In some embodiments, PDCs 320 are omitted or excluded from the Q inverter pairs 314 on the third and fourth series of inverters 310.

FIG. 4 is an example of a phase detector 120 circuit of the system 100 for quadrature delay high speed clock generation. The example phase detector 120 of FIG. 4 can include four unit cells 402 for processing input signals (e.g., signals 302, 304, 306 and 308). Each cell 402 can include a combination of transistors (e.g., NMOS 406 and PMOS 404) to compare phases of the input signals and the reference signal, including the in-phase (302 and 304) components of the signals and the quadrature (306 and 308) components. The output of cells 402 can provide one or more phase error signals 330 that can be used to drive the VCO 140 to achieve phase synchronization between the input and reference signals in the PLL circuit.

A cell 402 can include any combination of transistor or other circuit elements (e.g., capacitors, diodes or resistors) for processing one of the I 302, inverted I 304, Q 306 and inverted Q 308 signals. Each unit cell 402 can include two PMOS 404 transistors coupled with two NMOS 406 transistors. Each of the PMOS 404 and NMOS 406 transistors can include a source 410, a drain 412 and a gate 414. Each cell 402 can receive one of the four signals (e.g., 302, 304, 306 and 308) that are output from the buffer chain circuit 110. For example, a first cell 402 can receive a I 302 signal, a second cell 402 can receive a Q 306 signal, a third cell 402 can receive an inverted I 304 signal and a fourth cell 402 can receive an inverted Q 308 signal.

Each of the cells 402 can have the two sources 410 of the two NMOS 406 transistors be coupled with the input signal (e.g., 302, 304, 306 or 308). The drains 412 of the same NMOS 406 transistors can be coupled with the drains 412 of the two PMOS 404 on each side, such that each NMOS 406 is drain 412 to drain 412 coupled with the PMOS 404. Each of the PMOS 404 transistors can have a gate 414 coupled with a VSS signal (e.g., ground). Each of the PMOS 404 transistors can have its source 410 coupled with the gate of the other NMOS 406 that is different from the NMOS 406 transistor which the PMOS 404 is connected via the drain 412. In such a configuration, each unit cell 402 can include two NMOS 406 interconnected drain-to-drain with the two PMOS 404 whose gates are coupled to the VSS (e.g., ground) and where the source of the PMOS 404 are coupled with the gate of the opposite NMOS 406 from the one to which the PMOS 404 is drain-to-drain connected. Each of the PMOS 404 transistors can therefore be configured to operate in a triode region. The triode region can include a linear region of operation of the transistor, such as a region of operation in which a relationship between input and output is linear, as opposed to saturated or cut-off. The triode region can include a region of operation of a transistor device (e.g., BJT or MOSFET) in which a drain current is controlled by three terminals instead of two as in the saturation regime. Outputs from the phase detector 120 can be read using the output signals marked P0, P90, P180 and P270, corresponding to the phase angles of the quadrature signal outputs and provided, for example, in FIG. 5.

Figure 5:
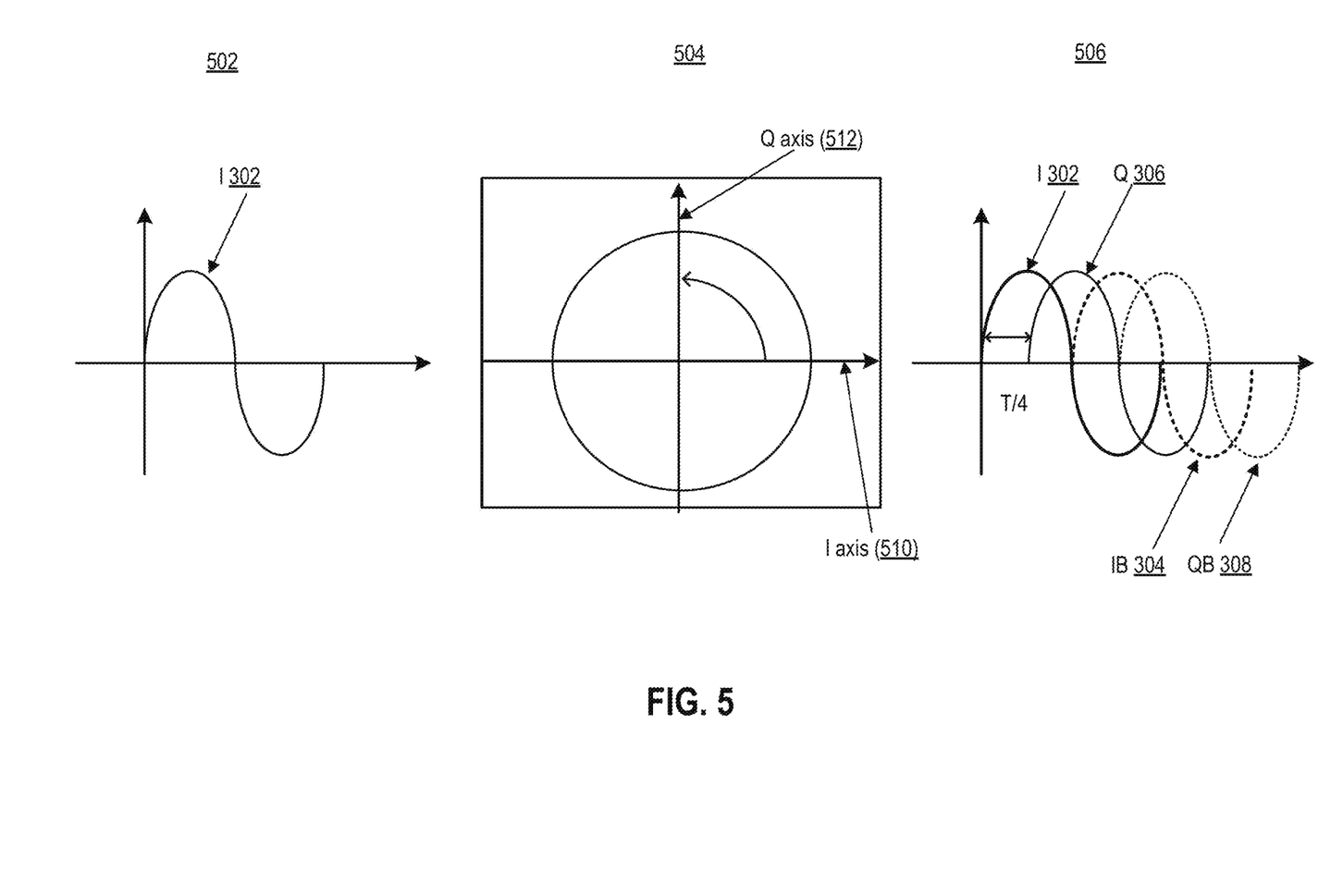
FIG. 5 is an example of plots of buffer chain output signals.

FIG. 5 is an example of plots of signal outputs from the buffer chain circuit 110 and/or phase detector 120. FIG. 5 illustrates plot 502 of a sinusoidal reference in-phase 302 signal. Plot 504 provides a circular phase plot on I axis 510 and Q axis 512. Plot 504 illustrates an example of a compilation of outputs of signals 302, 304, 306 and 308 forming a circle on a I-Q plane. Plot 506 illustrates a plot of I 302, Q 306, inverted I 304 and inverted Q 308, each one of which has its phase 90 degrees (e.g., T/4) spaced apart from the phase of another. Accordingly, I 302 is 90 degrees ahead of the Q 306, which is 90 degrees ahead of inverted I (IB) 304, which is 90 degrees ahead of inverted Q (QB) 308.

The present solution can be directed to a circuitry corresponding to a system 100 for clock generation. The circuitry can include a buffer chain circuit 110 having a first plurality of I inverter pairs 312 that can be configured to process and/or output an in-phase signal (I) 302 according to a first clock signal 202 received as a first input. The first plurality of I inverter pairs 312 can be configured to process and/or output an inverted I 304 signal (inverted I) according to a second clock signal 204 received as a second input. Each pair of the first plurality of I inverter pairs 312 can be coupled in parallel by a first circuit (e.g., phase delay circuit 320) to control a delay between the I 302 signal and the inverted I 304 signal. The phase delay circuit 320 can be connected between the output of each of the inverters 310 of the I inverter pairs 312.

The circuitry (e.g., buffer chain circuit 110) can include a second plurality of Q inverter pairs 314 configured to output a quadrature signal (Q) 306 according to a third clock signal 206 received as a third input. The second plurality of Q inverter pairs 314 can be configured to output an inverted Q signal 308 (inverted Q) according to a fourth clock signal 208 received as a fourth input. The circuitry can include three Q inverter pairs 314 for outputting signals 306 and 308 for input into the phase detector 120.

The circuitry can include a second circuit (e.g., phase detector 120) that can include a plurality of cells 402. Each of the plurality of cells 402 can be configured to receive at least one of the I signal 302, the inverted I signal 304, the Q signal 306 or the inverted Q signal 308. Each cell 402 can include at least one or more transistors, such as a bipolar junction transistors or BJTs, metal-oxide semiconductor field effect transistors or MOSFETs, junction gate field effect transistors or JFETs or any other transistor. Each cell 402 can include one or more transistors (e.g., MOSFETS, such as PMOS or NMOS) having a gate connected to a VSS or ground.

The first plurality of I inverter pairs 312 can include a first set of four inverters 310 that are connected (e.g., directly or indirectly) in a first series arrangement or connection to provide the I 302. The first plurality of I inverter pairs 312 can include a second set of four inverters 310 connected in a second series arrangement or connection to provide the inverted I 304. The second plurality of Q inverter pairs 314 can include a first set of three inverters 310 connected in a third series arrangement or connection to provide the Q 306 signal and a second set of three inverters 310 connected in a fourth series arrangement or connection to provide the inverted Q 308 signal.

The first circuit (e.g., PDC 320) to control the delay in phase can include one of a varactor (e.g., varactor diode) or a combination of a capacitor and a diode in a reverse bias orientation. The first circuit (e.g., PDC 320) to control the delay in phase can includes a first capacitor connected to a first diode in a forward bias orientation connected to a second diode in a reverse bias orientation connected to a second capacitor. PDC 320 can include a first contact from a first capacitor coupled with an output of a first inverter 310 from an I inverter pair 312 and a second contact from the first capacitor coupled with a first diode that is in forward bias with respect to the first capacitor and to a first leg of a resistor circuit in parallel with the first diode. The resistor circuit can include a tuning input signal for tuning the phase. The output from the first diode can be input into a second diode that is reverse biased, the output from which can be coupled with the second leg of the resistor circuit in parallel with the two diodes. The output of the second diode can be coupled with the first input of a second capacitor, whose second input can be coupled to an output of the second inverter 310 of the same I inverter pair 312. This same arrangement of the PDC 320 coupled in parallel with an I inverter pair 312 can be repeated for each of the four of the first five inverter pairs 312 of the buffer chain circuit 110.

A first inverter 310 of a first I inverter pair 312 of the first plurality of I inverter pairs 312 can include a first output connected to the first capacitor of the PDC 320. The first inverter 310 can be configured in a first set of inverters connected in a first series of inverters 310 to provide the I 302 signal. A second inverter 310 of the first I inverter pair 312 of the first plurality of I inverter pairs 312 can include a second output connected to the second capacitor of the PDC 320. The second inverter 310 can be configured in a second set of inverters connected in a second series to provide the inverted I 304 signal.

At least one or more transistors (e.g., PMOS 404 or NMOS 406) of each cell 402 of the second circuit (e.g., phase detector 120) can include two p-channel metal-oxide semiconductor (PMOS) 404 transistors. Each of the two PMOS 404 transistors can be configured to operate in a triode region. Each PMOS 404 can be configured to operate in the triode region based on its gate 414 coupled with VSS, whereas its source 410 is coupled with a gate 414 of the NMOS 406 that is different (e.g., opposite) from the NMOS 406 to which the drain 412 of the PMOS 404 connects.

For example, each cell 402 can include a first n-channel metal-oxide semiconductor (NMOS) 406 transistor having a drain 412 of the first NMOS 406 transistor connected to a drain 412 of a first PMOS 404 transistor of the two PMOS 404 transistors. The first NMOS 406 can have a gate 414 of the first NMOS 406 transistor coupled to a source 410 of a second PMOS 404 transistor of the two PMOS 404 transistors. Each cell 402 of the phase detector 120 can include a second NMOS 406 transistor having a drain 412 of the of the second NMOS 406 transistor coupled to a drain 412 of the second PMOS 404 transistor and a gate 414 of the second NMOS 406 transistor coupled to a source 410 of the first PMOS 404 transistor.

The plurality of cells 402 of the second circuit (e.g., phase detector 120) can include a first cell 402, a second cell 402, a third cell 402 and a fourth cell 402. The four cells 402 can be configured such that a source 410 of the first PMOS 404 transistor of the first cell 402 is connected with a source 410 of the second PMOS 404 transistor of the fourth cell 402 and a source 410 of the second PMOS 404 transistor of the first cell 402 is connected with a source 410 of the first PMOS 404 transistor of the second cell 402. The four cells 402 can be configured such that a source 410 of the first PMOS 404 transistor of the third cell is connected with a source 410 of the second PMOS 404 transistor of the second cell 402 and a source 410 of the second PMOS 404 transistor of the third cell 402 is connected with a source 410 of the first PMOS 404 transistor of the fourth cell 402.

The system 100 can include a quadrature generator 102 of a phase locked loop (PLL). The quadrature generator 102 can include an inductor 210 to provide as output the first clock signal 202, the second clock signal 204, the third clock signal 206 and the fourth clock signal 208. The first plurality of I inverter pairs 312 and the second plurality of Q inverter pairs 314 can be a part of a buffer chain circuit 110 of the phase locked loop (PLL). The buffer chain circuit 110 can be configured to provide to a phase detector 120 of the PLL at least one of the I 302, the inverted I 302, the Q 306 and the inverted Q 308 at a frequency of between 40 gigahertz and 50 gigahertz. In some embodiments, the frequency can vary by about 10% above or below the target frequency range.

The present solution can be directed to system 100 comprising a circuitry for providing a clock signal. The system 100 can include a voltage control oscillator 140 utilizing an inductor 210 to generate a first clock signal 202, a second clock signal 204, a third clock signal 206 and a fourth clock signal 208. The system 100 can include a buffer chain circuit 110. The buffer chain circuit 110 can include a first plurality of I inverter pairs 312 configured to output an in-phase signal (I) 302 according to a first clock signal 202 received as a first input and an inverted I signal (inverted I) 304 according to a second clock signal 204 received as a second input. Each pair of the first plurality of I inverter pairs 312 can be coupled in parallel by a first circuit (e.g., PDC 320) to control a delay in phase between the I 302 and the inverted I 304 signals. The buffer chain circuit 110 can include a second plurality of Q inverter pairs 314 configured to output a quadrature signal (Q) 306 according to a third clock signal 206 received as a third input and an inverted Q signal (inverted Q) 308 according to a fourth clock signal 208 received as a fourth input.

The system 100 can include a phase detector 120 comprising a plurality of cells 402. Each of the plurality of cells 402 can be configured to receive at least one of the I 302 signal, the inverted I 304 signal, the Q 306 signal or the inverted Q 308 signal. Each cell 402 can include at least one or more transistors having a gate connected to a ground. For example, each cell 402 can include a pair of PMOS 404 transistors having their gates coupled to a VSS or ground, while their drains 412 are coupled with drains 412 of the NMOS 406 transistors whose sources 410 are coupled with the input signals (e.g., 302, 304, 306 or 308).

The system 100 can include first plurality of I inverter pairs 312 including a first set of four inverters 310 connected in a first series to provide the I 302 and a second set of four inverters 310 connected in a second series to provide the inverted I 304. The second plurality of Q inverter pairs 314 can include a first set of three inverters 310 connected in a third series to provide the Q 306 and a second set of three inverters 310 connected in a fourth series to provide the inverted Q 308. In some embodiments, PDC 320 circuits are omitted or excluded from the second plurality of Q inverter pairs 314. The first circuit (e.g., PDC 320) to control the delay in phase can includes one of a varactor or a combination of a capacitor and a diode in a reverse bias orientation. The PDC 320 from the first plurality of I inverter pairs 312, with the combination of inverters 310 from the four series of inverters, can control the fixed phase in the I 302, inverted I 304, Q 306 and inverted Q 308.

Figure 6:
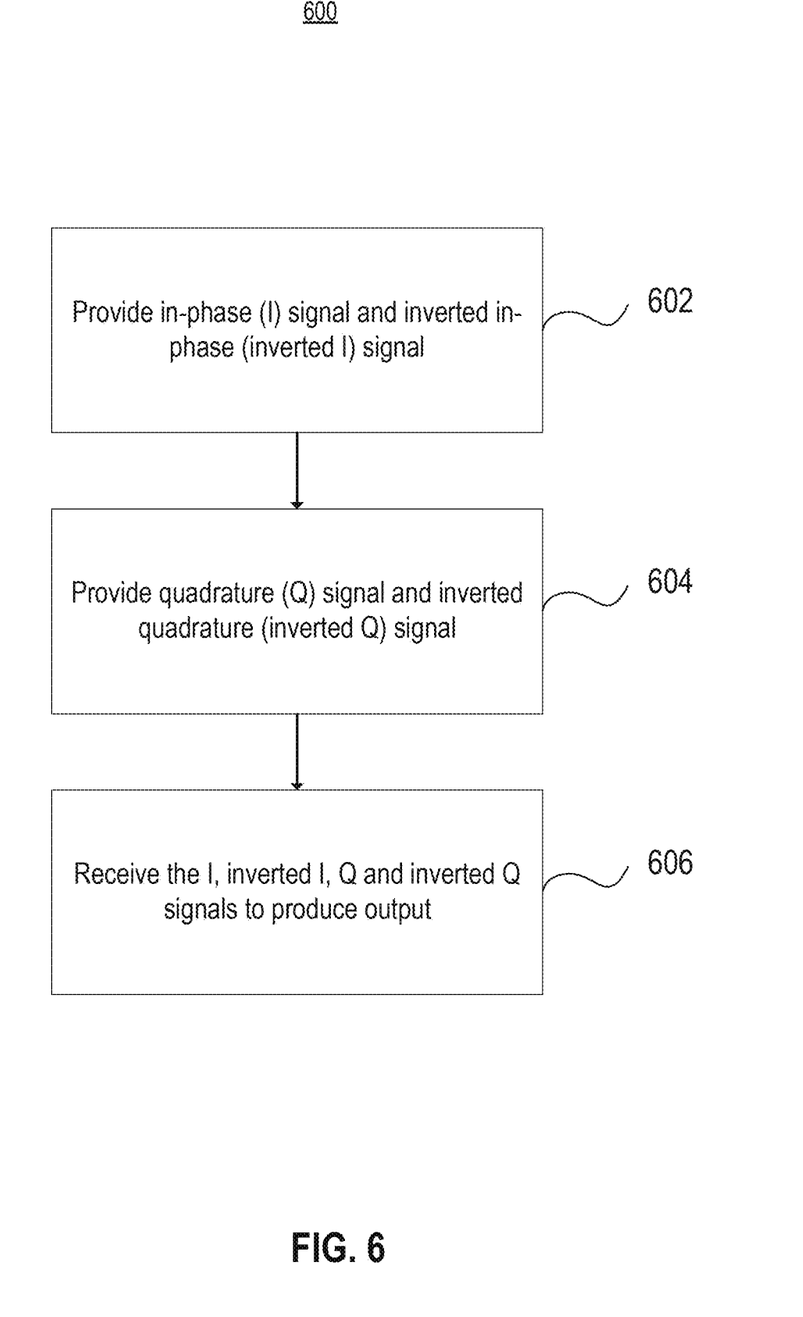
FIG. 6 illustrates an example flow diagram of a method for providing a quadrature delay high speed clock generation, in accordance with the embodiments of the present solution.

FIG. 6 is an example flow diagram of a method 600 method for clock generation using quadrature delay in accordance with the embodiments of the present solution. Method 600 can include acts 602 through 606 that can be implemented, for example, using the system 100 of FIGS. 1-4. For example, at 602, the method can include providing in-phase (I) signal and inverted in-phase (inverted I) signal. At 604, the method can include providing quadrature (Q) signal and inverted quadrature (inverted Q) signal. At 606, the method can include receiving the I, inverted I, Q, and inverted Q signals to produce output.

At 602, the method can include providing in-phase (I) signal and inverted in-phase (inverted I) signal. The method can include a first plurality of pairs of inverters (e.g., I inverter pairs) providing an in-phase signal (I) as an output according to a first clock signal received as a first input. The first plurality of pairs of inverters can provide an inverted I signal (inverted I) as an output according to a second clock signal received as a second input. Each pair of the first plurality of pairs of inverters can be coupled in parallel by a first circuit (e.g., phase delay circuit) to control a delay in phase between the I and the inverted I. The phase delay circuit can control the phase delay between the I and inverted I. The phase delay circuit can control the phase delay between the I signal and the Q signal and the inverted I and inverted Q signal.

A first set of four inverters of the first plurality of pairs of inverters can provide the I signal. The first set of four inverters can be connected in a first series of inverters. The first series of inverters can receive as its input the first clock signal or the second clock signal. A second set of four inverters of the first plurality of pairs of inverters can provide the inverted I, the second set of four inverters connected in a second series. The second set of four inverters can be connected in a second series of inverters and can receive the first or the second clock signal, as the input.

The first circuit (e.g., phase delay circuit) to control the delay in phase can include a first capacitor connected in series to a first diode in a forward bias orientation. The first diode can be connected in the same series to a second diode in a reverse bias orientation that can be connected in the same series to a second capacitor. Parallel to the two diodes can be one or more resistors that can also include a signal input to tune the first circuit (e.g., phase delay).

The first plurality of pairs of inverters (e.g., I inverter pair) can include a first inverter of a first pair of the first plurality of pairs. The first inverter can include a first output connected to the first capacitor of the phase delay circuit. The first inverter can be configured in a first set of inverters connected in a first series to provide the I signal. The first plurality of pairs of inverters can include a second inverter of the first pair of the first plurality of pairs of inverters. The second inverter can include a second output connected to the second capacitor (e.g., of the same phase delay circuit) and can be configured in a second set of inverters connected in a second series to provide the inverted I signal.

At 604, the method can include providing quadrature (Q) signal and inverted quadrature (inverted Q) signal. The method can include a second plurality of pairs of inverters providing a quadrature signal (Q) as an output according to a third clock signal received as a third input. The second plurality of pairs of inverters can provide an inverted Q signal (inverted Q) as an output according to a fourth clock signal received as a fourth input. For example, the second plurality of pairs of inverters can include three Q inverter pairs, each one including two inverters, where one of the inverters is from a third series of inverters for providing a Q signal and the other one is from a fourth series of inverters for providing an inverted Q signal.

A first set of three inverters of the second plurality of pairs of inverters can provide the Q signal. The first set of three inverters can be connected or arranged in a third series. The third series can provide the Q signal responsive to the third clock signal or the fourth clock signal used as the input into the third series. The second set of three inverters of the second plurality of pairs of inverters can provide the inverted Q signal. The second set of three inverters can be connected or arranged in a fourth series. The fourth series can provide the inverted Q signal responsive to the third clock signal or the fourth clock signal used as the input into the fourth series. The first series and the fourth series can be limited to three inverters, following which the Q and inverted Q signals can be provided to the phase detector.

At 606, the method can include receiving the I, inverted I, Q and inverted Q signals to produce output. The method can include a plurality of cells of a second circuit (e.g., phase detector) receiving the inverted I signal, the Q signal and the inverted Q signal to produce an output. The output can include a phase error signal, which can be provided to the amplifying circuit to be amplified and provided to the voltage controller oscillator. Each of the plurality of cells of the second circuit (e.g., phase detector) can be configured to receive at least one of the I signal, the inverted I signal, the Q signal or the inverted Q signal. Each one of the plurality of cells can include at least one or more transistors having a gate connected to a ground.

The least one or more transistors of each cell of the second circuit that has a gate connected to the ground can include two p-channel metal-oxide semiconductor (PMOS) transistors. For example, a cell of the phase detector can include a pair of PMOS transistors, each one having a gate connected to VSS or ground and configured to operate in a triode region. The cell of the second circuit (e.g., phase detector) can include a first n-channel metal-oxide semiconductor (NMOS) transistor having a drain of the first NMOS transistor connected to a drain of a first PMOS transistor of the two PMOS transistors of the cell and a gate of the first NMOS transistor coupled to a source of a second PMOS transistor of the two PMOS transistors. A second NMOS transistor of the cell can include a drain of the of the second NMOS transistor coupled to a drain of the second PMOS transistor of the cell and a gate of the second NMOS transistor of the cell coupled to a source of the first PMOS transistor of the cell.

The plurality of cells of the second circuit (e.g., phase detector) can include a first cell, a second cell, a third cell and a fourth cell configured such that a source of the first PMOS transistor of the first cell is connected with a source of the second PMOS transistor of the fourth cell and a source of the second PMOS transistor of the first cell is connected with a source of the first PMOS transistor of the second cell. The second circuit (e.g., phase detector) can include a source of the first PMOS transistor of the third cell is connected with a source of the second PMOS transistor of the second cell and a source of the second PMOS transistor of the third cell is connected with a source of the first PMOS transistor of the fourth cell. Accordingly, the second circuit can include four interconnected cells, where each of the four cells is connected, via sources of the two PMOS transistors of the cell to at least two other cells of the second circuit.

The method can include a quadrature generator of a phase locked loop (PLL) comprising an inductor providing the first clock signal, the second clock signal, the third clock signal and the fourth clock signal as output. The output can be used as input to the buffer chain circuit. The first plurality of I inverter pairs of the buffer chain circuit and the second plurality of Q inverter pairs of the buffer chain circuit of the PLL can be configured to provide to a phase detector of the PLL at least one (or each one) of the I, the inverted I, the Q and the inverted Q at a frequency of between about 40 gigahertz and about 50 gigahertz.

It should be noted that certain passages of this disclosure can reference terms such as "first" and "second" in connection with device signals, data, inputs, channels, etc., for purposes of identifying or differentiating one from another or from others. These terms are not intended to merely relate entities (e.g., a first input and a second input) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components. In addition, the systems and methods described above can be provided as one or more computer-readable programs or executable instructions, programmable circuits, or digital logic embodied on or in one or more articles of manufacture. The article of manufacture can be a central processing unit, a microcontroller, a hard disk, a flash memory card, a PROM, a RAM, a ROM, ASIC or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A circuitry, comprising:
   a first plurality of pairs of inverters configured to output an in-phase signal (I) according to a first clock signal received as a first input and an inverted I signal (inverted I) according to a second clock signal received as a second input, wherein each pair of the first plurality of pairs of inverters is coupled in parallel by a first circuit to control a delay in phase between the I and the inverted I, wherein the first plurality of pairs of inverters includes a first set of four inverters connected in a first series to provide the I and a second set of four inverters connected in a second series to provide the inverted I;
   a second plurality of pairs of inverters configured to output a quadrature signal (Q) according to a third clock signal received as a third input and an inverted Q signal (inverted Q) according to a fourth clock signal received as a fourth input; and
   a second circuit comprising a plurality of cells, each of the plurality of cells configured to receive at least one of the I signal, the inverted I signal, the Q signal or the inverted Q signal, wherein each cell includes at least one transistor having a gate connected to a ground.

2. The circuitry of claim 1, wherein the plurality of cells of the second circuit comprises a first cell of the plurality of cells to receive the I signal, a second cell of the plurality of cells to receive the inverted I signal, a third cell of the plurality of cells to receive the Q signal and a fourth cell of the plurality of cells to receive the inverted Q signal.

3. The circuitry of claim 1, wherein the second plurality of pairs of inverters includes a first set of three inverters connected in a third series to provide the Q and a second set of three inverters connected in a fourth series to provide the inverted Q.

4. The circuitry of claim 1, wherein the first circuit to control the delay in phase includes one of a varactor or a combination of a capacitor and a diode in a reverse bias orientation.

5. The circuitry of claim 1, wherein the first circuit to control the delay in phase includes a first capacitor connected to a first diode in a forward bias orientation, wherein the first diode is also connected to a second diode in a reverse bias orientation and wherein the second diode is also connected to a second capacitor.

6. The circuitry of claim 5, comprising:
a first inverter of a first pair of the first plurality of pairs of inverters, the first inverter comprising a first output connected to the first capacitor and arranged in a first set of inverters connected in a first series to provide the I; and
a second inverter of the first pair of the first plurality of pairs of inverters, the second inverter comprising a second output connected to the second capacitor and configured in a second set of inverters connected in a second series to provide the inverted I.

7. The circuitry of claim 1, wherein the at least one or more transistors of each cell of the second circuit includes two p-channel metal-oxide semiconductor (PMOS) transistors, each of the two PMOS transistors configured to operate in a triode region.

8. The circuitry of claim 7, wherein each cell of the plurality of cells includes:
a first n-channel metal-oxide semiconductor (NMOS) transistor having a drain of the first NMOS transistor connected to a drain of a first PMOS transistor of the two PMOS transistors and a gate of the first NMOS transistor coupled to a source of a second PMOS transistor of the two PMOS transistors; and
a second NMOS transistor having a drain of the of the second NMOS transistor coupled to a drain of the second PMOS transistor and a gate of the second NMOS transistor coupled to a source of the first PMOS transistor.

9. The circuitry of claim 8, wherein the plurality of cells of the second circuit include a first cell, a second cell, a third cell and a fourth cell configured such that:
a source of the first PMOS transistor of the first cell is connected with a source of the second PMOS transistor of the fourth cell and a source of the second PMOS transistor of the first cell is connected with a source of the first PMOS transistor of the second cell; and
a source of the first PMOS transistor of the third cell is connected with a source of the second PMOS transistor of the second cell and a source of the second PMOS transistor of the third cell is connected with a source of the first PMOS transistor of the fourth cell.

10. The circuitry of claim 1, comprising a quadrature generator of a phase locked loop (PLL), the quadrature generator comprising an inductor to provide as output the first clock signal, the second clock signal, the third clock signal and the fourth clock signal.

11. The circuitry of claim 1, wherein the first plurality of pairs and the second plurality of pairs is a part of a buffer chain circuit of a phase locked loop (PLL), the buffer chain circuit configured to provide to a phase detector of the PLL at least one of the I, the inverted I, the Q and the inverted Q at a frequency of between 40 gigahertz and 50 gigahertz.

12. The method of claim 1, wherein the at least one or more transistors of each cell of the second circuit includes two p-channel metal-oxide semiconductor (PMOS) transistors, each of the two PMOS transistors configured to operate in a triode region.

13. The method of claim 12, wherein each cell of the plurality of cells includes:
a first n-channel metal-oxide semiconductor (NMOS) transistor having a drain of the first NMOS transistor connected to a drain of a first PMOS transistor of the two PMOS transistors and a gate of the first NMOS transistor coupled to a source of a second PMOS transistor of the two PMOS transistors; and
a second NMOS transistor having a drain of the of the second NMOS transistor coupled to a drain of the second PMOS transistor and a gate of the second NMOS transistor coupled to a source of the first PMOS transistor.

14. The method of claim 13, wherein the plurality of cells of the second circuit include a first cell, a second cell, a third cell and a fourth cell configured such that:
a source of the first PMOS transistor of the first cell is connected with a source of the second PMOS transistor of the fourth cell and a source of the second PMOS transistor of the first cell is connected with a source of the first PMOS transistor of the second cell; and
a source of the first PMOS transistor of the third cell is connected with a source of the second PMOS transistor of the second cell and a source of the second PMOS transistor of the third cell is connected with a source of the first PMOS transistor of the fourth cell.

15. A method, comprising:
providing, by a first plurality of pairs of inverters, an in-phase signal (I) as an output according to a first clock signal received as a first input and an inverted I signal (inverted I) as an output according to a second clock signal received as a second input, wherein each pair of the first plurality of pairs of inverters is coupled in parallel by a first circuit to control a delay in phase between the I and the inverted I, wherein the first plurality of pairs of inverters includes a first set of four inverters connected in a first series to provide the I and a second set of four inverters connected in a second series to provide the inverted I;
providing, by a second plurality of pairs of inverters, a quadrature signal (Q) as an output according to a third clock signal received as a third input and an inverted Q signal (inverted Q) as an output according to a fourth clock signal received as a fourth input; and
receiving, by a plurality of cells of a second circuit, the inverted I signal, the Q signal and the inverted Q signal to produce an output, wherein each of the plurality of cells is configured to receive at least one of the I signal, the inverted I signal, the Q signal or the inverted Q signal and includes at least one or more transistors having a gate connected to a ground.

16. The method of claim 15, comprising:
providing, by a first set of three inverters of the second plurality of pairs of inverters, the Q, the first set of three inverters connected in a third series; and
providing, by a second set of three inverters of the second plurality of pairs of inverters, the inverted Q, the second set of three inverters connected in a fourth series.

17. The method of claim 15, wherein:

the first circuit to control the delay in phase includes a first capacitor connected to a first diode in a forward bias orientation connected to a second diode in a reverse bias orientation connected to a second capacitor, the first plurality of pairs of inverters includes a first inverter of a first pair of the first plurality of pairs, the first inverter comprising a first output connected to the first capacitor and configured in a first set of inverters connected in a first series to provide the I; and a second inverter of the first pair of the first plurality of pairs of inverters, the second inverter comprising a second output connected to the second capacitor and configured in a second set of inverters connected in a second series to provide the inverted I.

18. The method of claim 15, comprising:

providing, by a quadrature generator of a phase locked loop (PLL) comprising an inductor, the first clock signal, the second clock signal, the third clock signal and the fourth clock signal as output, wherein the first plurality of pairs and the second plurality of pairs is a part of a buffer chain circuit of a phase locked loop (PLL), the buffer chain circuit configured to provide frequency of between 40 gigahertz and 50 gigahertz.

19. A system comprising:

a circuitry for providing a clock signal comprising:

a voltage control oscillator using one or more inductors to provide a first clock signal, a second clock signal, a third clock signal and a fourth clock signal;

a buffer chain comprising:

a first plurality of pairs of inverters configured to output an in-phase signal (I) according to a first clock signal received as a first input and an inverted I signal (inverted I) according to a second clock signal received as a second input, wherein each pair of the first plurality of pairs of inverters is coupled in parallel by a first circuit to control a delay in phase between the I and the inverted I, wherein the first plurality of pairs of inverters includes a first set of four inverters connected in a first series to provide the I and a second set of four inverters connected in a second series to provide the inverted I;

a second plurality of pairs of inverters configured to output a quadrature signal (Q) according to a third clock signal received as a third input and an inverted Q signal (inverted Q) according to a fourth clock signal received as a fourth input; and a phase detector comprising a plurality of cells, each of the plurality of cells configured to receive at least one of the I, the inverted I, the Q or the inverted Q, wherein each cell includes at least one or more transistors having a gate connected to a ground.

20. The system of claim 19, wherein:

the second plurality of pairs of inverters includes a first set of three inverters connected in a third series to provide the Q and a second set of three inverters connected in a fourth series to provide the inverted Q; and the first circuit to control the delay in phase includes one of a varactor or a combination of a capacitor and a diode in a reverse bias orientation.

* * * * *